United States Patent [19]

Stowers et al.

[11] 4,344,033

[45] Aug. 10, 1982

[54] VACUUM-ACTUATED TEST FIXTURE FOR PRINTED CIRCUIT BOARDS

[75] Inventors: Jeffrey P. Stowers, Mt. Sidney; Robert E. Stickle, Raphine; Herbert B. Cash, Waynesboro, all of Va.

[73] Assignee: Virginia Panel Corporation, Waynesboro, Va.

[21] Appl. No.: 186,462

[22] Filed: Sep. 12, 1980

[51] Int. Cl.[3] .................... G01R 31/02; G01R 15/12
[52] U.S. Cl. ......................... 324/158 F; 324/73 PC;
 324/158 P; 339/117 P
[58] Field of Search ........... 324/158 F, 158 P, 73 PC;
 339/117 PC

[56] References Cited

U.S. PATENT DOCUMENTS 4,017,793  4/1977  Haines ............................ 324/158 F
4,321,533  3/1982  Matrone ......................... 324/158 F

*Primary Examiner*—Ernest F. Karlsen
*Attorney, Agent, or Firm*—B. P. Fishburne, Jr.

[57] ABSTRACT

For in-circuit and functional testing of loaded printed circuit boards with speed and precision, a vacuum-actuated test fixture utilizes a yielding diaphragm assembly with rigid frame and spring-loaded diaphragm base plate, to distribute downward atmospheric pressure evenly over the entire area of the board without localized stress concentrations. A captive removable diaphragm frame and quick-acting spring-loaded cam latches assure a positive seal around the margin of the diaphragm assembly and along top and bottom edge portions thereof. Ease of assembly and disassembly is promoted. A plug-in vacuum adapter with manual valve provides quick hook-up of the test fixture to a vacuum source. A lower base frame and patchboard assembly allow efficient interfacing of the text fixture with a suitable receiver frame of test apparatus.

14 Claims, 13 Drawing Figures

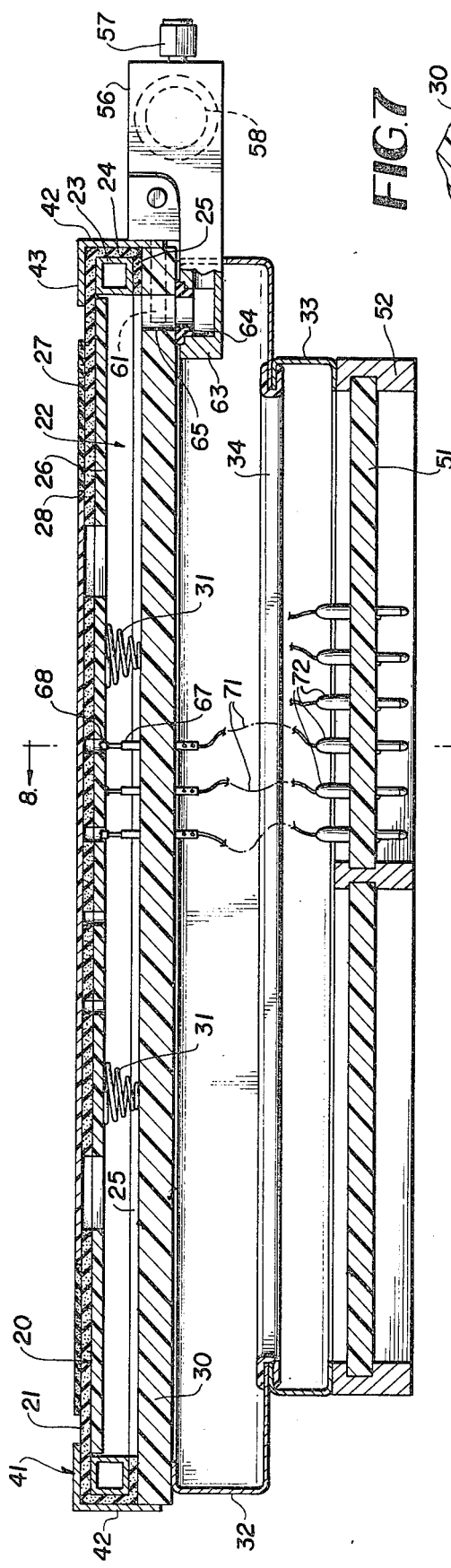
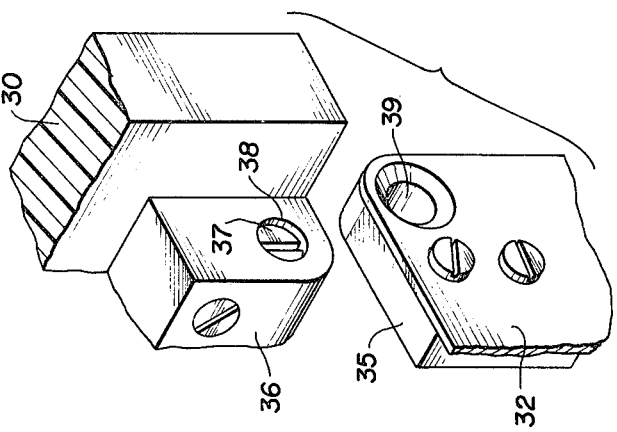
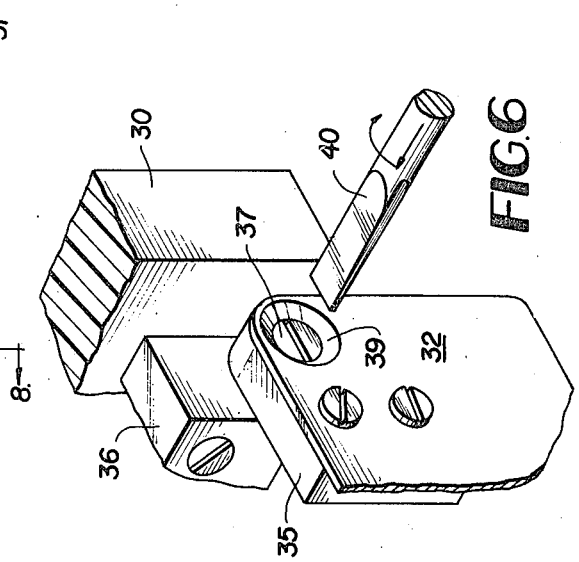
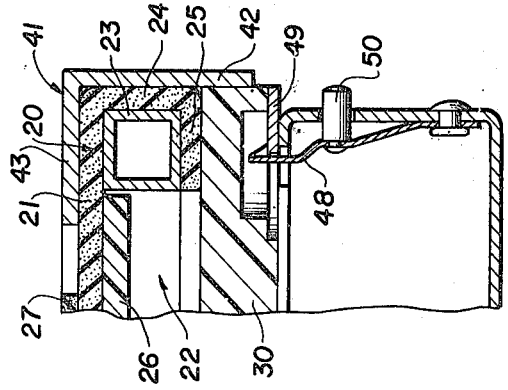

VACUUM-ACTUATED TEST FIXTURE FOR PRINTED CIRCUIT BOARDS

BACKGROUND OF THE INVENTION

The object of the invention is to fulfill a need in the art for a more efficient and reliable test fixture for in-circuit and functional testing of loaded printed circuit boards. More particularly, the invention seeks to provide a vacuum-actuated PCB test fixture constructed to provide a more positive and reliable seal for the vacuum chamber of the test fixture. The improved vacuum sealing means is achieved through a unique diaphragm assembly and cam locked capturing frame which also renders the assembling and disassembling of the device convenient and quick.

A further important object is to provide in a vacuum-actuated test fixture for PCBs means to assure distribution of atmospheric pressure evenly over the board undergoing testing so that possibly damaging localized stress concentrations are eliminated.

While certain test fixtures for testing printed circuit boards are known in the prior art, no known device possesses the simplicity, reliability, convenience of use, and the functional integrity of the invention for testing PCBs with speed and precision.

Various additional features and advantages of the invention will become apparent during the course of the following detailed description.

BRIEF DESCRIPTION OF THE DRAWINGS

FIG. 3 is an enlarged vertical section taken on line 3—3 of FIG. 1.

FIG. 5 is an enlarged fragmentary vertical section taken on line 5—5 of FIG. 1.

FIG. 6 is an enlarged fragmentary perspective view showing a quick-release hinge pin and associated elements.

FIG. 7 is a similar view showing the hinge pin locked in a release position.

DETAILED DESCRIPTION

Figure 1:
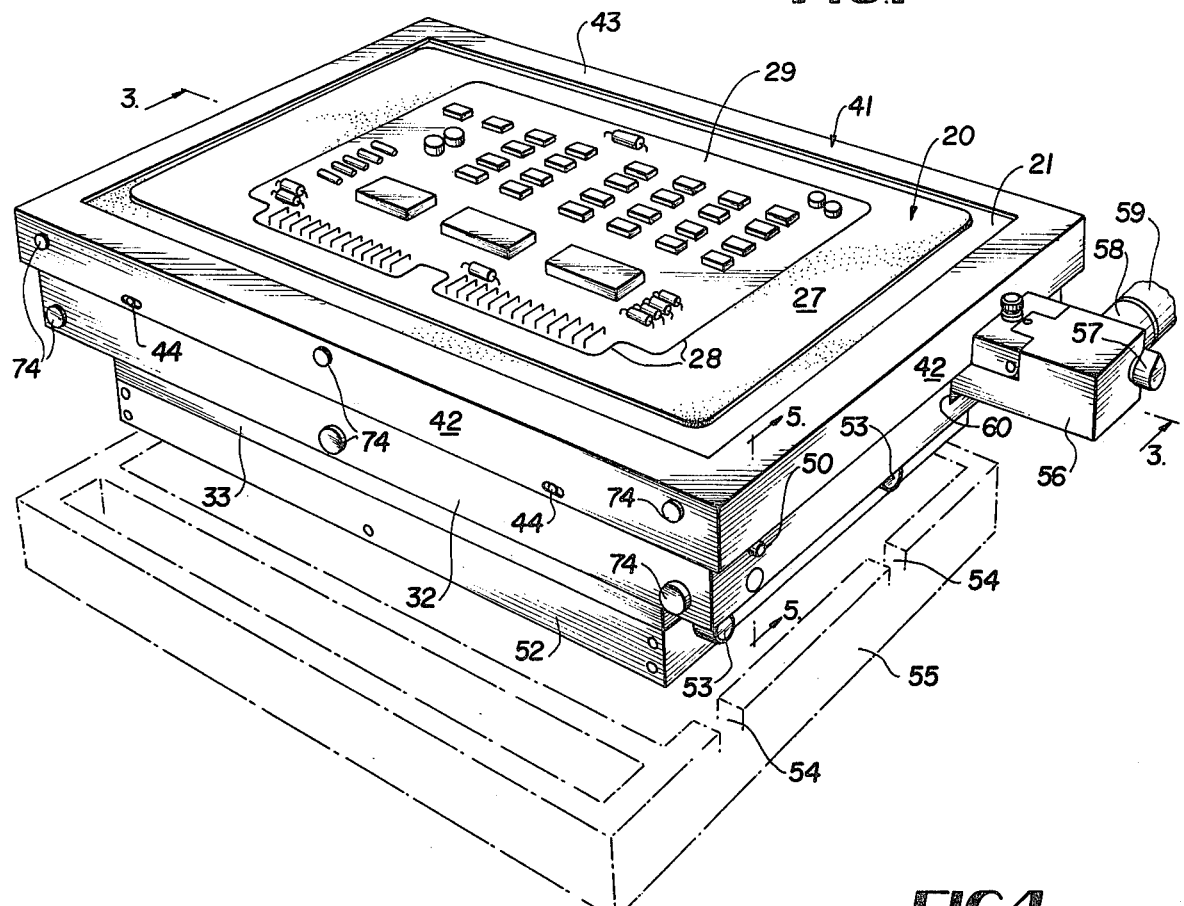
FIG. 1 is a perspective view of a vacuum-actuated test fixture for printed circuit boards according to the invention.

Referring to the drawings in detail wherein like numerals designate like parts, a diaphragm assembly 20 forming a key feature of the invention comprises a preferably 3/16ths inch thick continuous neoprene sheet 21 forming a yielding diaphragm spanning the top of a vacuum chamber 22. The marginal edge portion of the sheet or diaphragm 21 lies across the top face of a rigid rectangular cross section hollow diaphragm frame 23 and is wrapped about the outer vertical face of this frame and beneath its lower horizontal base as best shown at 24 and 25 in FIG. 5. The portions of the yielding diaphragm surrounding the four sides of the diaphragm frame 23 are adhesively bonded to the frame. The body portion of the diaphragm 21 inwardly of the frame 23 is comparatively taut. It should be understood that the wrapped edge portions 24 and 25 of the diaphragm 21 extend continuously without interruption around the four sides of the diaphragm assembly 20 as clearly shown in FIG. 2.

The diaphragm assembly 20 further comprises a rigid back-up panel 26 beneath the diaphragm 21 to assure flatness and evenness thereof, and this back-up panel is adhesively secured to the bottom face of the diaphragm and disposed closely and floatingly inside of the rigid frame 23.

The top of yielding diaphragm 21 carries a neoprene overlay layer 27 adhesively bonded thereto and this overlay layer is adapted to be carved out and custom profiled as at 28 to accept a loaded PCB 29 undergoing testing in a test fixture. The carved out portion of the layer 27 serves to locate the PCB 29 in the test fixture and additional positive locator pins, not shown, carried by the back-up panel 26 may enter locator openings, not shown, in the PCB 29, if desired. The PCB 29 may be of any configuration at its margin and may carry wide varieties of circuit components. The test fixture diaphragm can easily have its overlay layer 27 customized or cut-out to accept a variety of PCB profiles and sizes, without altering any other components of the structure.

Immediately beneath the diaphragm assembly 20 is a flat rigid rectangular base plate 30 defining the bottom of vacuum chamber 22. The top and sides of this shallow vacuum chamber are defined by the diaphragm assembly, as best shown in FIGS. 3 and 5. The base plate 30 carries a plurality of biasing springs 31 distributed over the area of the base plate 30 and engaging the bottom of back-up panel 26 to constantly bias it with the attached diaphragm 21 upwardly to a taut level position as shown in FIG. 3. The base plate 30 is hingedly attached near one of its longer edges to a base plate supporting frame 32 which in turn is mounted on a somewhat smaller spacer frame 33 rigid therewith. The meeting faces of frames 32 and 33 are sealed by a continuous marginal U-cross section seal 34 which eliminates sharp edges.

Figure 2:
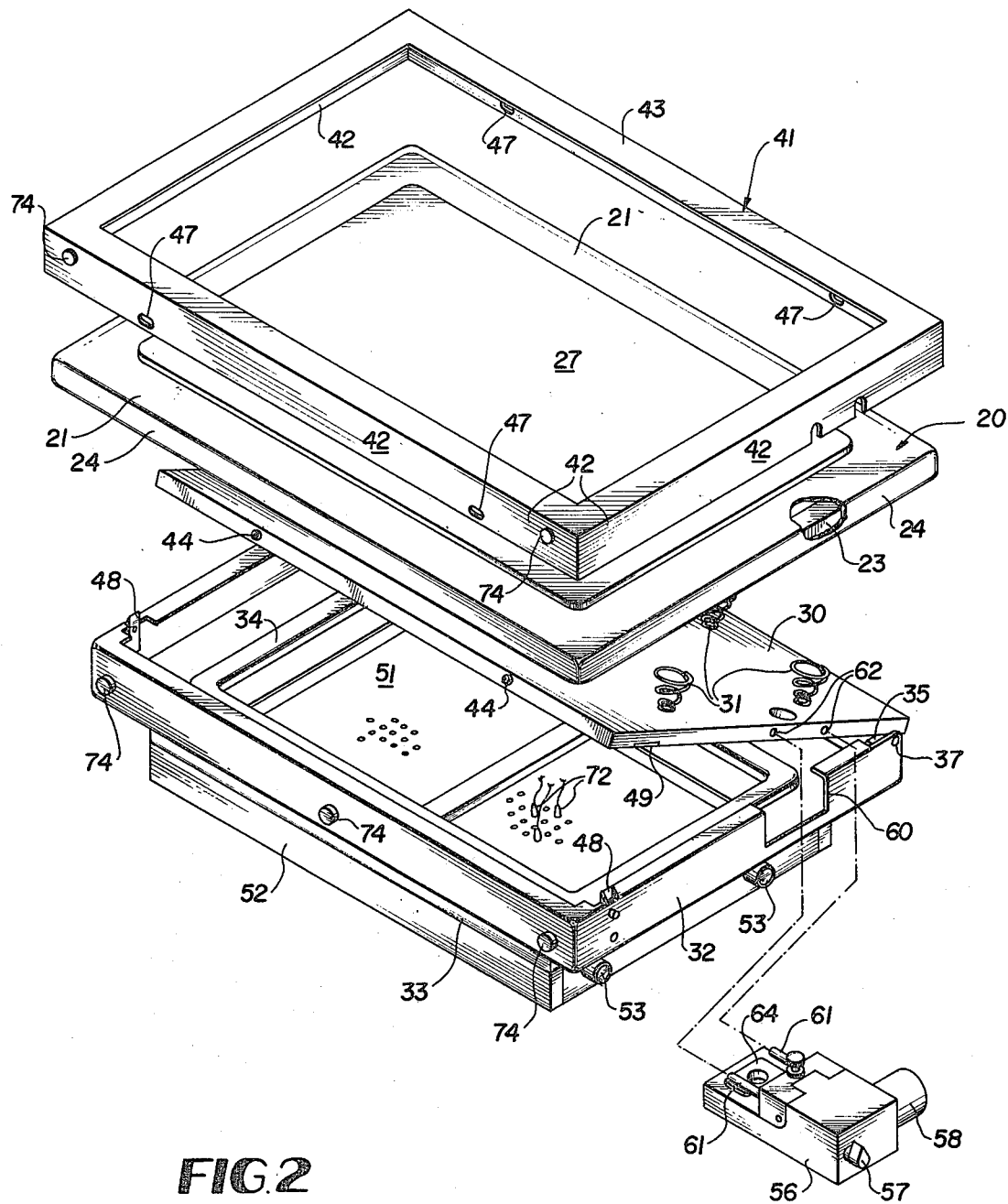
FIG. 2 is an exploded perspective view of the test fixture.

The base plate support frame 32 carries reinforcing hinge plates 35 near its rear corners and coacting hinge blocks 36 are attached to the bottom of base plate 30, FIGS. 6 and 7. Spring-loaded snap lock hinge pins 37 having screwdriver slots are held within socket openings 38 in the blocks 36. Receiver openings 39 for the hinge pins 37 are provided in the plates 35 and the side walls of frame 32. When the snap lock hinge pins 37 are turned one-quarter turn in one direction by a screwdriver 40, they will spring outwardly and into the openings 39 to establish hinged connections between the base plate 30 and its support frame 32, allowing the base plate to be raised about its hinge axis, as shown in FIG. 2. When the hinge pins 37 are turned one-quarter turn in the opposite direction by the screwdriver 40, FIG. 6, they can be forced axially inwardly against spring tension to the retracted release positions, FIG. 7, within the socket openings 38, and will remain in such positions until released by the screwdriver. This allows easy removal of the entire test head of the fixture composed of diaphragm assembly 20, base plate 30 and a diaphragm capturing or retaining frame 41, now to be described, and forming another key element of this invention.

The diaphragm capturing frame 41 is rectangular, rigid in construction, continuous around all sides of the device, and L-shaped in cross section. The vertical walls 42 of the frame 41 fit snugly over the vertical edge portions 24 of diaphragm 21, FIGS. 3 and 5. The top horizontal wall or flange 43 of frame 41 laps the top of diaphragm 21 above the top wall of its frame 23 and extends a bit inwardly of the frame 23 and slightly beyond the marginal edge of back-up panel 26 to stabilize the latter under the biasing action of springs 31. The vertical walls 42 of frame 41 also lap the marginal edges of base plate 30 for further stability in the head of the test fixture. When a partial vacuum is created in the chamber 22 through means yet to be described, the elastic diaphragm 21 inwardly of the rigid frame 23 with its floating back-up panel 26 is drawn downwardly evenly against the biasing springs 31 which yield. An effective vacuum seal is maintained at this time at the top, bottom and outer side faces of the frame 23 by the wrapped edge portions of the diaphragm 21 and between these wrapped portions and the opposing surface of base plate 30 and opposing surfaces of capturing frame 41.

Figure 10:
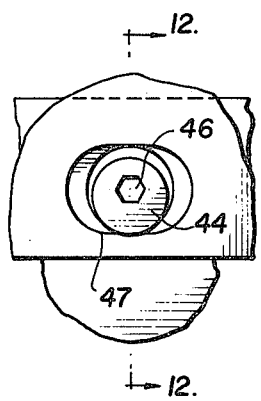
FIG. 10 is a fragmentary elevational view of a quick-release cam latch for the diaphragm capturing frame in the locking position.
Figure 11:
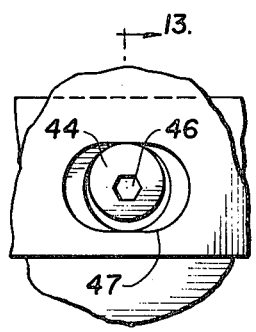
FIG. 11 is a similar view of the cam latch in a retracted release position.
Figure 12:
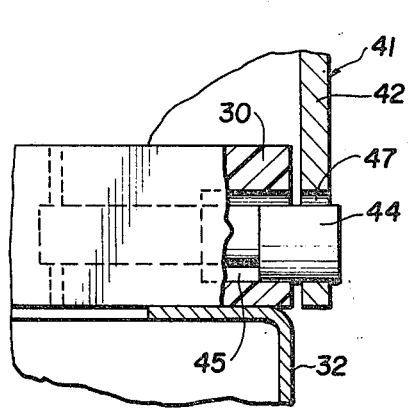
FIG. 12 is a fragmentary vertical section taken on line 12—12 of FIG. 10.
Figure 13:
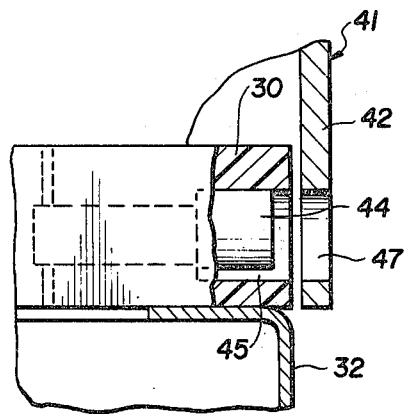
FIG. 13 is a similar section taken on line 13—13 of FIG. 11.

The frame 41 forms an important element in the creation of an effective seal around all sides of the diaphragm assembly 20 due to its clamping action on the top of this assembly above the rigid frame 23. This important clamping action is attained by the operation of four efficient spring-loaded eccentric cam latches 44, FIGS. 10 through 13, held within bores 45 in the front and rear edges of base plate 30. The spring-loaded cam latches have allen wrench openings 46 in their forward ends to facilitate turning them. The latches 44 are spring-biased forwardly, FIG. 12, toward entry into locking slots 47 in the vertical walls 42 of frame 41. When in their forward latching positions, FIGS. 10 and 12, the eccentric cam latches 44 are rotated into cam locking engagement with the bottoms of the slots 47 so as to draw the frame 41 tightly down onto the top of the elastic diaphragm 41 in the region of the rigid frame 23, which is also being opposed by the base plate 30 beneath it. This action squeezes the captured top and bottom edge portions of the diaphragm 21 and causes some expansion of the captured vertical edge portion 24 to create an extremely effective seal above, below and at the outer sides of frame 23 around all four sides of the diaphragm assembly.

A further convenience feature of the invention resides in the provision of two leaf spring latches 48 on opposite sides of base plate support frame 32 near the forward corners thereof. These latches are biased into locking engagement with the edges of latch plates 49 on the bottom of base plate 30 and are released by push buttons 50 secured to the spring latches. This convenience feature allows ready raising of the base plate 30 for access to the wiring between it and a patchboard 51 held within a test adapter frame 52 fixed to the bottom of spacing frame 33. On its opposite sides, adapter frame 52 carries pairs of precision locator rollers 53 adapted to engage within locator slots 54 of a receiver frame 55, FIG. 1, separate from the present invention. The receiver frame 55 shown in phantom lines in FIG. 1 is employed for the purpose of interfacing the test fixture with suitable coacting test apparatus and for the stable support of the test fixture.

A further feature of the invention is the provision of an easily removable plug-in vacuum adapter 56 on one side of the apparatus. The adapter 56 has a manual rotary on-off vacuum valve knob 57 and a vacuum inlet fitting 58 adapted for coupling to a hose 59, FIG. 1, extending to a remote vacuum source, not shown. The frame 32 is notched at 60 to provide clearance for the vacuum adapter and a pair of locator pins 61 on the adapter are received supportively in guide openings 62 provided in the adjacent side edge of base plate 30. As best shown in FIG. 3, a down-stepped extension 63 of the vacuum adapter engages beneath the base plate 30, and an upwardly facing vacuum seal 64 on the extension 63 sealingly engages the lower face of the base plate surrounding a bore 65 formed through the base plate and placing vacuum chamber 22 in communication with the interior of the vacuum adapter.

Figure 8:
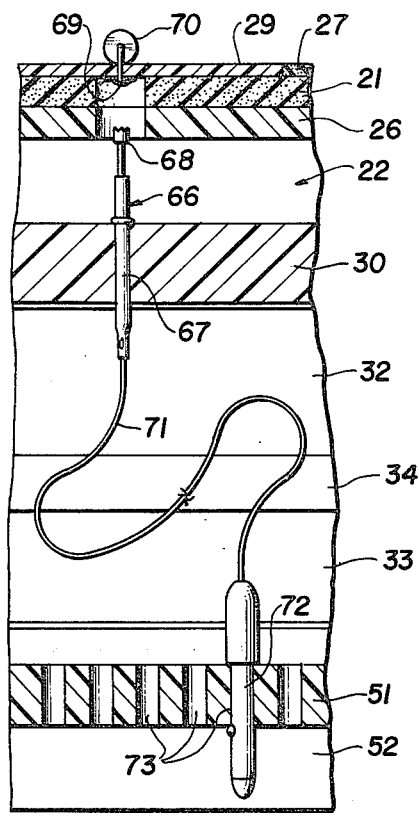
FIG. 8 is an enlarged fragmentary vertical section taken on line 8—8 of FIG. 3.
Figure 9:
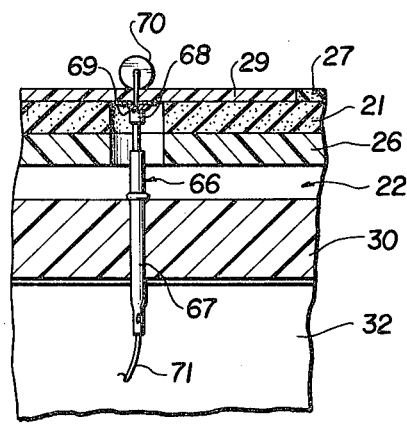
FIG. 9 is a similar section depicting electrical contact between a spring contact element of the test fixture and an element of the PCB undergoing testing when vacuum is applied to the fixture.

As stated previously, the PCB 29 may be loaded with any number of components included in circuits, the integrity of which are to be tested by the test fixture. As best shown in FIGS. 8 and 9, the base plate 30 carries multiple readily replaceable spring probes or contacts 66 having mounting sleeves 67 mounted within openings of the base plate 30. Upwardly spring-biased contact heads 68 contained within the sleeves 67 are adapted for electrical contact under spring pressure with terminals 69 of components 70 on the PCB 29. This electrical contact occurs when a partial vacuum is created through the vacuum adapter 56 in the chamber 22 of the test fixture. Such partial vacuum causes atmospheric pressure acting on the diaphragm 21 and PCB 29 to evenly depress the diaphragm against the biasing springs 31 sufficiently to establish contact between the spring-loaded contact heads 68 and terminals 69 of circuitry on the PCB undergoing testing.

It should be understood that the replaceable spring probes or contacts 66 on the base plate 30 can be arrayed thereon in many ways to correspond with the arrangement of components and circuitry elements on the PCB 29 which may be varied. The particular arrangement of the spring probes 66 can be customized by the user of the test fixture or by its manufacturer. A large supply of the probes 66 can be provided and held within extra openings in the base plate 30 near one edge thereof outside of the area encompassed by the PCB 29. Depending upon the character of the PCB circuitry, the spring probes 66 may be arrayed in continuous straight rows or interrupted rows or they may be randomly arrayed to satisfy the circuitry test requirements.

Lead wires 71 trailing from the test probes 66 are contained within a space between the base plate 30 and the patchboard 51. They are attached to ball detent terminal elements 72 releasably held within openings 73 of the patchboard 51. The arrangement holds the terminals 72 firmly in place, promotes ease of wiring the test fixture, and prevents the terminals from being pushed out of place when electrical contact is made with coacting test apparatus through the receiver frame 55. The character of the coacting electrical test apparatus may vary and forms no part of this invention.

Figure 4:
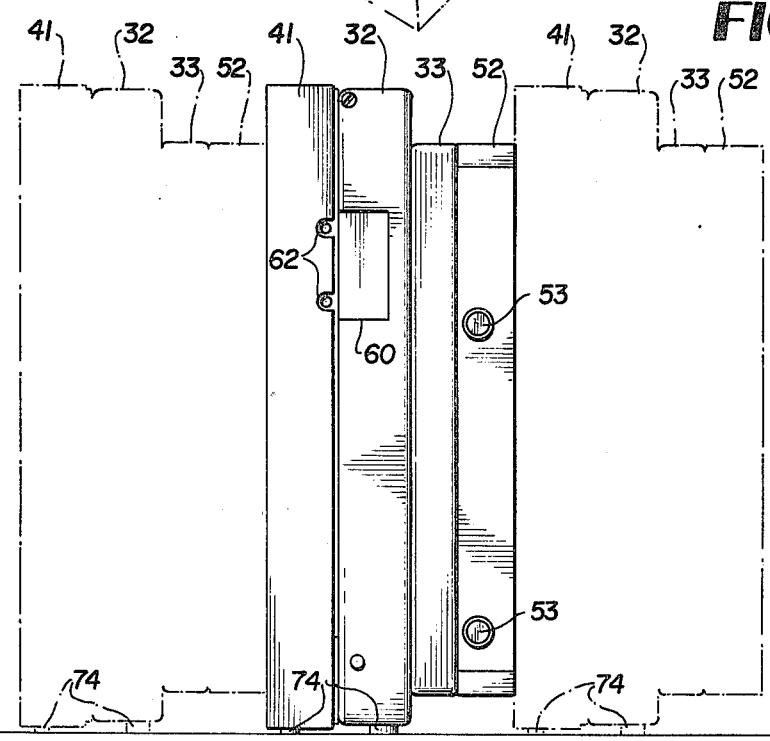
FIG. 4 is an end elevation of the test fixture depicting vertical storage thereof with other like test fixtures.

A further feature of the invention lies in the provision on corresponding sides of the frame 21 and base plate support frame 32 of Delrin stand-off buttons 74 which enable the test fixture to stand on its side of vertical storage with a number of like fixtures, see FIG. 4.

An optional feature, not shown on the drawings contributing to the precision operation of the test fixture, is the provision on the back-up panel 26 near diagonally opposite corners thereof of locator pins which may enter locator openings in the base plate 30, not shown.

In use, the loaded PCB 29 is placed in the cut-out of the overlay layer 27 which has been prefabricated as previously explained to accept a PCB of given configuration. This spring contact probes 66 and ball detent terminals 72 are properly prearranged in the base plate 30 and patchboard 51 to carry out the test. The base plate 30 is lowered and locked by the latches 48 and the cam latches 37 are adjusted to lock the diaphragm assembly capturing frame 41 tightly in place. The vacuum valve knob 57 is turned to admit vacuum to the chamber 22 and instantly the terminals 69 of the PCB 29 will be drawn downwardly to electrical contact with the spring-loaded contact heads 68 of the test fixture. The coacting test apparatus, not shown, may indicate visually, audibly or in any other conventional way that the PCB circuitry is intact or defective, as the case may be. Upon completion of the test, the knob 57 is turned to release the vacuum in chamber 22 and the springs 31 will return the diaphragm 21 and PCB supported thereon to the normal elevated position of FIGS. 3 and 8.

The test fixture is characterized by simplicity of construction, flexibility, ease of assembly and disassembly, and overall convenience of use. It promotes precision high speed testing of PCBs regardless of their configurations with consistency. Its many improvement features should now be apparent to those skilled in the art.

It is to be understood that the form of the invention herewith shown and described is to be taken as a preferred example of the same, and that various changes in the shape, size and arrangement of parts may be resorted to, without departing from the spirit of the invention or scope of the subjoined claims.

I claim:

1. A vacuum-actuated test fixture for a printed circuit board comprising a diaphragm assembly, said assembly including an elastic diaphragm body and a marginal rigid frame for said body, the diaphragm body having marginal edge portions engaging around the top, sides and bottom of said frame and being secured thereto, a base plate supporting the diaphragm assembly and having a top face in contact with the portions of said diaphragm body engaged with the bottom of said frame, there being a vacuum chamber between the top of the base plate and the diaphragm body inwardly of said frame, means for establishing a partial vacuum within said chamber, and a diaphragm assembly capturing frame engageable over and around said assembly adjacent to said frame and serving to compress said portions of the diaphragm body engaging around the top, sides and bottom of the frame, and releasable means to secure said capturing frame in operative relationship with the diaphragm assembly.

2. A vacuum-actuated test fixture as defined in claim 1, and a back-up panel adhered to the bottom of the elastic diaphragm body and disposed within the confines of said marginal rigid frame floatingly, and biasing springs for said back-up panel and diaphragm body arranged between said panel and said base plate and urging the panel and diaphragm body away from the base plate.

3. A vacuum-actuated test fixture as defined in claim 1, and said capturing frame being of L-cross section including a top wall bearing on the top of the diaphragm body above said marginal rigid frame and a side wall engaging the outer face of the portion of the diaphragm body at the side of the marginal rigid frame.

4. A vacuum-actuated test fixture as defined in claim 1, and said releasable means comprising quick releasable cam locking means on two sides of the test fixture.

5. A vacuum-actuated test fixture as defined in claim 4, and the quick releasable cam locking means comprising turnable and axially shiftable spring-loaded eccentric cam latches held within edge openings of the base plate and adapted when extended to enter cam locking openings in said capturing frame.

6. A vacuum-actuated test fixture as defined in claim 1, and said means for establishing a partial vacuum within said chamber comprising a readily removable plug-in vacuum adapter having an on-off manual vacuum valve and including a vacuum passage means in communication with said chamber.

7. A vacuum-actuated test fixture as defined in claim 6, and said base plate having an opening in communication with said chamber and in communication with said vacuum passage means, said vacuum adapter having an extension engaging beneath the base plate adjacent to the base plate opening and including an upwardly facing vacuum seal engaging the bottom of the base plate around the base plate opening.

8. A vacuum-actuated test fixture as defined in claim 7, and spaced locator pins on the vacuum adapter engageable removably within edge locator openings of the base plate.

9. A vacuum-actuated test fixture as defined in claim 1, and a support frame for the base plate, and means forming a quick detachable hinge connection between the base plate and said support frame near corresponding edges thereof.

10. A vacuum-actuated test fixture as defined in claim 9, and a patchboard adapter frame for said test fixture secured to the base plate support frame in spaced parallel relationship thereto.

11. A vacuum-actuated test fixture as defined in claim 10, and multiple spring contact probes releasably held in openings of the base plate and adapted for electrical contact with elements on a printed circuit board undergoing testing in the test fixture.

12. A vacuum-actuated test fixture as defined in claim 11, and a corresponding number of ball detent terminals held releasably in openings of a patchboard carried by the patchboard adapter frame.

13. A vacuum-actuated test fixture as defined in claim 1, and said marginal rigid frame being rectangular in cross section, said capturing frame including two right angular wall portions engaging around a corner of the rectangular cross section marginal rigid frame along each side thereof.

14. A vacuum-actuated test fixture as defined in claim 11, and said diaphragm body and back-up panel each having registering clearance openings to accommodate said spring contact probes.

* * * * *